(12) United States Patent
Hashimoto

(10) Patent No.: US 7,061,127 B2
(45) Date of Patent: Jun. 13, 2006

(54) SEMICONDUCTOR DEVICE, MANUFACTURING METHOD AND MOUNTING METHOD OF THE SEMICONDUCTOR DEVICE, CIRCUIT BOARD, AND ELECTRONIC APPARATUS

(75) Inventor: Nobuaki Hashimoto, Suwa (JP)

(73) Assignee: Seiko Espon Corporation, Tokyo (JP)

( * ) Notice: Subject to any disclaimer, the term of this patent is extended or adjusted under 35 U.S.C. 154(b) by 0 days.

(21) Appl. No.: 10/779,710

(22) Filed: Feb. 18, 2004

(65) Prior Publication Data

US 2004/0183178 A1 Sep. 23, 2004

(30) Foreign Application Priority Data

Feb. 27, 2003 (JP) .............................. 2003-051119

(51) Int. Cl.
*H01L 23/544* (2006.01)

(52) U.S. Cl. ..................... 257/797; 438/64; 438/123

(58) Field of Classification Search ................ 438/64, 438/71, 82, 98, 123; 257/797
See application file for complete search history.

(56) References Cited

U.S. PATENT DOCUMENTS

| | | | | |
|---|---|---|---|---|
| 5,512,712 A | * | 4/1996 | Iwata et al. ................ | 174/258 |
| 5,887,343 A | * | 3/1999 | Salatino et al. .............. | 29/833 |
| 5,923,966 A | * | 7/1999 | Teramoto et al. ............ | 438/162 |
| 6,278,193 B1 | * | 8/2001 | Coico et al. ................ | 257/797 |
| 6,355,976 B1 | * | 3/2002 | Faris ......................... | 257/686 |
| 6,583,445 B1 | * | 6/2003 | Reedy et al. ................ | 257/82 |
| 6,744,144 B1 | * | 6/2004 | Peterson ..................... | 257/797 |

FOREIGN PATENT DOCUMENTS

| | | |
|---|---|---|
| JP | A 11-191598 | 7/1999 |
| JP | A 11-195667 | 7/1999 |
| JP | A 2000-40773 | 2/2000 |
| JP | A 2003-17619 | 1/2003 |

\* cited by examiner

*Primary Examiner*—Caridad Everhart
(74) *Attorney, Agent, or Firm*—Oliff & Berridge, PLC

(57) ABSTRACT

To easily determine an orientation of a semiconductor device, a semiconductor device includes a substrate including electrode electrically connected to an integrated circuit, an external terminal electrically connected to the electrode, and a light transmissive insulation layer provided on the external terminal side of the substrate, and a mark provided on the substrate and covered by the insulation layer and recognizable through the insulation layer.

13 Claims, 4 Drawing Sheets

SEMICONDUCTOR DEVICE, MANUFACTURING METHOD AND MOUNTING METHOD OF THE SEMICONDUCTOR DEVICE, CIRCUIT BOARD, AND ELECTRONIC APPARATUS

BACKGROUND OF THE INVENTION

1. Field of Invention

The present invention relates to a semiconductor device, a manufacturing method and a mounting method of the semiconductor device, a circuit board, and an electronic apparatus.

2. Description of Related Art

Wafer level chip size package (CSP) is widely spreading as a package of a semiconductor device. In the related art, an orientation of a semiconductor device, as an end product, is specified by markings provided on the reverse of the element forming side on which its elements are formed. In other words, in related art, it is impossible to determine an orientation of a semiconductor device from the element forming side because of structural limitations of a semiconductor device. In particular, if a plurality of external terminals are disposed symmetrically, it is extremely difficult to determine an orientation of the semiconductor device according to its structure.

In the present invention an orientation of a semiconductor can be easily determined.

SUMMARY OF THE INVENTION (1) A semiconductor device according to one aspect of the present invention includes: a substrate having an electrode electrically connected to at least one integrated circuit; an external terminal electrically connected to the electrode; a light transmissive insulation layer disposed on the external terminal side of the substrate; and a mark provided on the substrate and covered by the insulation layer so as to be recognized through the insulation layer. According to an aspect of the present invention, an orientation of the semiconductor device can be easily determined by recognizing the mark through the insulation layer from the external terminal side of the substrate. Thus, an orientation of the semiconductor device can be determined from the structure of the semiconductor device in itself, enhancing handling efficiency of the semiconductor device.

(2) In this semiconductor device, the substrate can be a semiconductor substrate, and the integrated circuit can be formed on the semiconductor substrate.

(3) In the above semiconductor device, there are provided: a resin layer formed around the electrode and on the same side of the semiconductor substrate as the side provided with the electrode; and a interconnection layer extending from the electrode to the upper surface of the resin layer and including at least one land formed on the resin layer; the external terminal may be provided on the land; and the insulation layer may be formed to cover the interconnection layer with at least a part of the external terminal exposed.

(4) In the above semiconductor device, the mark may be provided on the resin layer.

(5) In the above semiconductor device, there is provided a passivation film provided on the semiconductor substrate, and the mark may be provided on the passivation film.

(6) In the above semiconductor device, the mark may be made of the same material as at least a part of the material which the interconnection layer is made of. Thus, for example, the interconnection layer and the mark are formed in the same manufacturing process.

(7) In the above semiconductor device, the mark may be provided on an area not contacting with the interconnection layer.

(8) In the above semiconductor device, the interconnection layer may include a plurality of lands including a first land having a shape incorporating the mark and a second land having a shape different from the shape of the first land. According to this, since a part or the whole of the first land serves as the mark, the number of components can be reduced.

(9) In the above semiconductor device, the external terminal may be a solder ball, and the insulation layer may be a solder resist.

(10) In the above semiconductor device, the semiconductor substrate may be a semiconductor chip.

(11) In the above semiconductor device, the mark may be provided on at least one of the four corners of the semiconductor chip.

(12) In the above semiconductor device, the semiconductor substrate may be a semiconductor wafer including the integrated circuit for each of plural areas.

(13) A circuit board according to another aspect of the present invention has a semiconductor device mentioned above mounted thereon.

(14) An electronic apparatus according to still another aspect of the present invention includes a semiconductor device mentioned above.

(15) A method of mounting a semiconductor device onto a circuit board according to still another aspect of the present invention includes: determining a mounting orientation of the semiconductor device mentioned above by recognizing the mark though the insulation layer.

(16) A method of manufacturing a semiconductor device according to still another aspect of the present invention includes: providing a mark on one side of a substrate having an electrode electrically connected to an integrated circuit; providing an external terminal electrically connected to the electrode on the mark side of the substrate; and providing a light transmissive insulation layer to cover the mark.

DETAILED DESCRIPTION OF EXEMPLARY EMBODIMENTS

Hereinafter, exemplary embodiments of the present invention are explained referring to accompanying figures.

Figure 1:
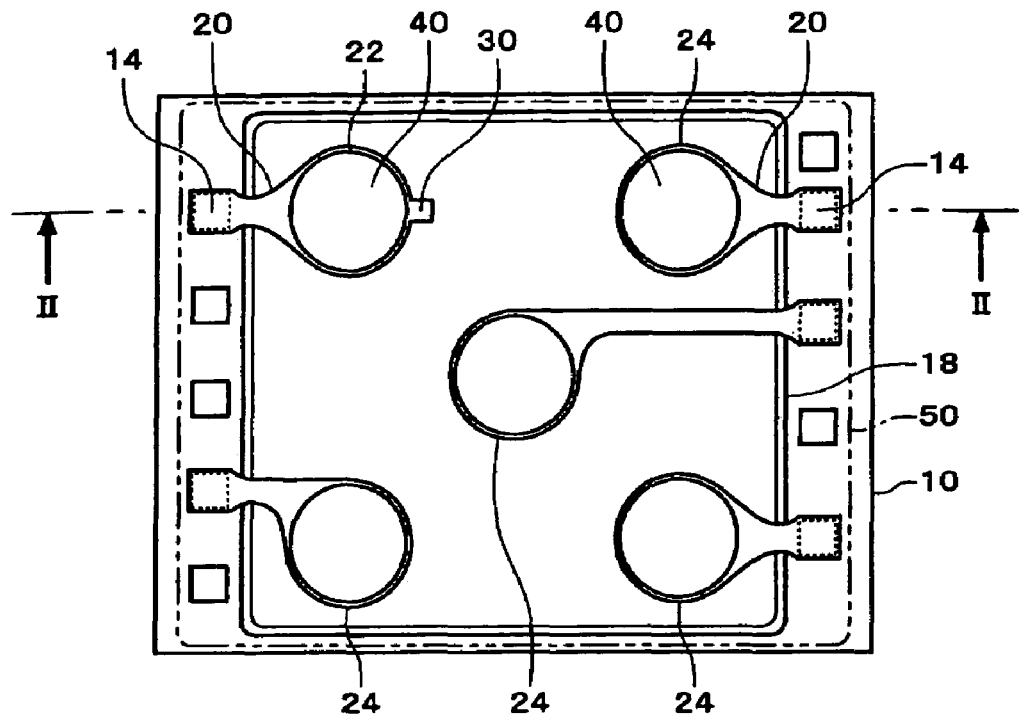
FIG. 1 shows a plan view of a semiconductor device according to an exemplary embodiment of the present invention.
Figure 2:
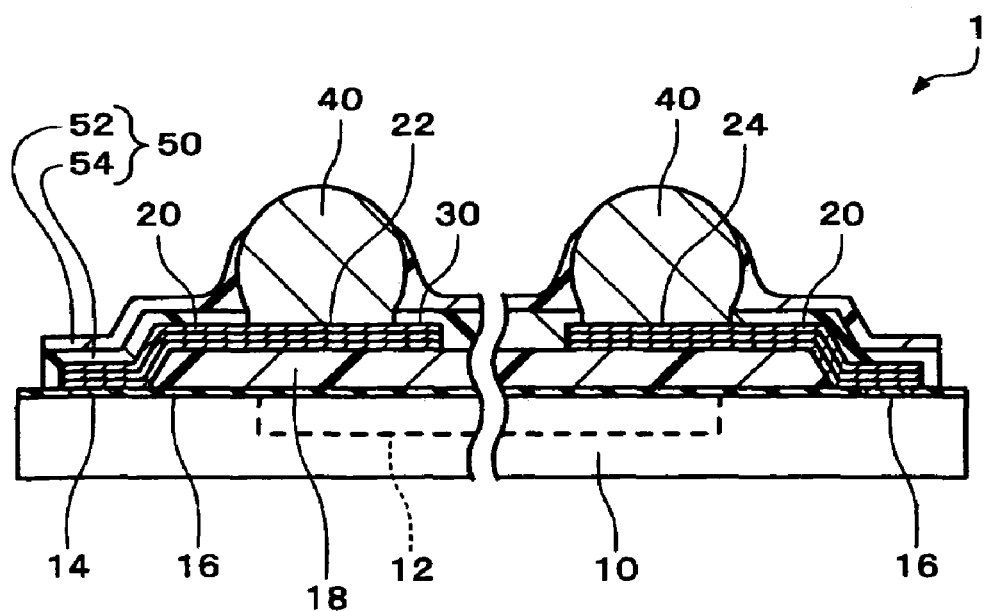
FIG. 2 shows a cross-sectional view of the semiconductor device according to an exemplary embodiment of the present invention.

FIG. 1 shows a plan view of a semiconductor device of the present exemplary embodiment with a part (a insulation layer 50) thereof removed. FIG. 2 shows a cross-sectional view (a section along II—II plane in FIG. 1) of the semiconductor device of the present exemplary embodiment. FIGS. 3 through 6 show partial plan views of semiconductor devices showing other examples of the mark.

A semiconductor device 1 includes a substrate (a semiconductor substrate 10 in the present exemplary embodiment). The semiconductor substrate 10 can be a semiconductor chip as shown in FIG. 1 or a semiconductor wafer. The semiconductor substrate 10 is provided with an integrated circuit 12 formed thereon (See FIG. 2.) and further with an electrode (e.g., a pad) 14 electrically connected with the integrated circuit 12. In case of a semiconductor ship, the integrated circuit 12 is often formed on a single region, while the integrated circuit 12 is often formed on each of multiple regions in case of a semiconductor wafer. A plurality of electrodes 14 may be formed on either surface of the semiconductor substrate 10. The plurality of electrodes 14 can be arranged along an edge portion (e.g., two opposing sides or four sides) of the semiconductor chip (or a region to become the semiconductor chip). The side of the semiconductor substrate 10 (the side with the electrode 14 formed thereon) is provided with a passivation film (e.g., a silicon nitride film or a silicon oxide film) 16 formed thereon.

In the present exemplary embodiment, the side of the semiconductor substrate 10 (e.g., a surface of the passivation film 16) provided with the electrode 14 is further provided with a resin layer 18 including a single layer or multiple layers. The resin layer 18 is formed around the electrodes 14. As shown in FIG. 1, the resin layer 18 can be formed on a center portion of the semiconductor chip. The resin layer 18 may have a side face slanted so that the bottom surface thereof is larger than the opposing upper surface thereof. The resin layer 18 may have a tension reduction function. The resin layer 18 may be made of resin, such as polyimide resin, silicone-modified polyimide resin, epoxy resin, silicone-modified epoxy resin, benzocyclobutene (BCB), or polybenzoxazole (PBO). The resin layer 18 may be formed between the semiconductor substrate 10 and an external terminal 40 described later.

In the present exemplary embodiment, the semiconductor device 1 includes interconnection layer 20. The interconnection layer 20 is formed on the same side of the semiconductor substrate 10 as the side provided with the electrode 14. The interconnection layer 20 is made of conductive material (e.g., metal). A plurality of discrete regions of the interconnection layer 20 is formed as shown in FIG. 1 each consisting of one or more layers. In case of plural layers, the interconnection layer 20 may be made of a combination of a plurality of different materials (e.g., cupper (Cu), chromium (Cr), titanium (Ti), nickel (Ni), titanium-tungsten (TiW), gold (Au), aluminum (Al), nickel-vanadium (NiV), tungsten (W), etc.). The discrete regions of the interconnection layer 20 are formed to cover the electrodes 14 and electrically connected with the electrodes 14. The discrete regions of the interconnection layer 20 extend from the electrodes 14 onto the resin layer 18. The discrete regions of the interconnection layer 20 are formed so as to extend to the upper surface of the resin layer 18 through its side face (the slanted face).

The discrete regions of the interconnection layer 20 include plural lands (a first and second lands 22, 24 in the present exemplary embodiment). The lands are electrical terminals, and provided with plated layers (not shown in the figures) to enhance electrical characteristics. The lands are formed on the resin layer 18. The lands are wider than lines of the discrete regions of the interconnection layer 20, and can be shaped as, for example round lands.

The semiconductor device 1 includes a plurality of external terminals 40. The external terminals 40 are formed on the same side of the semiconductor substrate 10 as the side on which the electrodes 14 are formed. The external terminals 40 are electrically connected to the electrodes 14. As shown in FIGS. 1 and 2, the external terminals 40 are electrically connected to the discrete regions of the interconnection layer 20. The external terminals 40 can be formed on the lands. The external terminals 40 can be made of conductive metal. The external terminals 40 can also be made of brazing material. The external terminals 40 can be shaped as, for example, a sphere, and can be solder balls. In the example shown in FIG. 1, the plurality of external terminals 40 is disposed symmetrically in plan view of the semiconductor substrate 10.

The semiconductor device 1 includes an insulation layer 50 (e.g., a layer made of resin). The insulation layer 50 has translucency, and can be made of translucent or transparent material. The insulation layer 50 is formed of a single or multiple layers (a first and second insulation layers 54, 52 in the example shown in FIG. 2). The insulation layer 50 is formed on the same side of the semiconductor substrate 10 as the side on which the external terminals 40 are formed. In detail, the insulation layer 50 is formed to cover the interconnection layer 20 with at least a part of the external terminals 40 exposed (with the tip of the external terminals 40 exposed). The insulation layer 50 can also serve as a solder resist.

In the example shown in FIG. 2, the insulation layer 50 includes the first and the second insulation layers 54, 52. The first and the second insulation layers 54, 52 are translucent as described above. The first insulation layer 54 can be formed after fabrication of the interconnection layer 20 so as to cover at least a part of each of the discrete regions of the interconnection layer 20. As shown in FIG. 2, the first insulation layer 54 can be formed outside at least center portions of the lands. Oxidization, corrosion, or breaking of the interconnection layer 20 can be avoided by forming the first insulation layer 54.

The second insulation layer 52 is stacked on the first insulation layer 54. The second insulation layer 52 can be formed on the first insulation layer 54 after fabrication of the external terminals 40. The second insulation layer 52 is formed with tip portions of the external terminals 40 exposed. In this case, the second insulation layer 52 covers root portions (lower end portions) of the external terminals 40. Thus, the root portions of the external terminals 40 are reinforced.

The semiconductor device 1 includes a mark 30. The mark 30 is formed on the same side of the semiconductor substrate 10 as the side on which the external terminals 40 are formed (e.g., on the resin layer 18), and is covered with the insulation layer 50 (the first and the second insulation layers 54, 52 in FIG. 2). Since the insulation layer 50 has translucency, the mark 30 can be recognized through the insulation layer 50. Thus, since the insulation layer 50 is provided on the mark 30, breakage, separation, or discoloration caused by oxidization can be reduced or prevented ensuring that an orientation of a semiconductor device is determined using the mark 30.

The position or the shape of the mark 30 is arranged so that at least an orientation (plan orientation) of the semiconductor device 1 (or the semiconductor substrate 10) can be acknowledged. For example, the mark 30 may be formed to have a shape by which either direction can be recognized (e.g., a shape of an arrow or the like). Or, the mark 30 may be disposed at an end portion of the semiconductor substrate 10 (e.g., at a corner thereof). Thus, an orientation of the semiconductor device can be determined only by recognizing the position of the mark 30 (even if its shape cannot be recognized). Note that the mark 30 may be a single mark or a plurality of marks as well.

The mark 30 can be made of the same material as at least a part of the interconnection layer 20 (at least one layer if the interconnection layer 20 comprises multiple layers). For example, if the interconnection layer 20 is made of metal, the mark 30 may also be made of the metal. If the interconnection layer 20 includes multiple layers, the mark 30 may also include the multiple layers. By this structure, the mark 30 may be formed in the process for forming the interconnection layer 20, thus reducing the cost and the number of manufacturing processes.

In the example shown in FIGS. 1 and 2, any one of the plural lands has the mark 30 as its part. In further detail, the shape of the first land 22, provided at least one includes the mark 30, and the shape of the second land 24, is different from the shape of the first land 22. In the example shown in FIG. 1, the shape of the first land 22 includes a round part and a protrusion (a quadrangular part in FIG. 1) protruding from the round part, one of the external terminals 40 being provided on a center portion of the round part, and the protrusion serving as the mark 30. The protrusion may be provided on the opposite side of the first land 22 to the line thereof. For example, the first land 22 as a whole may be recognized as the mark 30. According to this, since the part or the whole of the first land 22 serves as the mark 30, the number of components of the semiconductor device can be reduced. Further, space of the semiconductor device can be efficiently used compared to the case of forming the mark 30 independently. This is especially efficient for application to CSP (chip size package) in which the sizes of the semiconductor device and the semiconductor chip are substantially the same.

Figure 3:
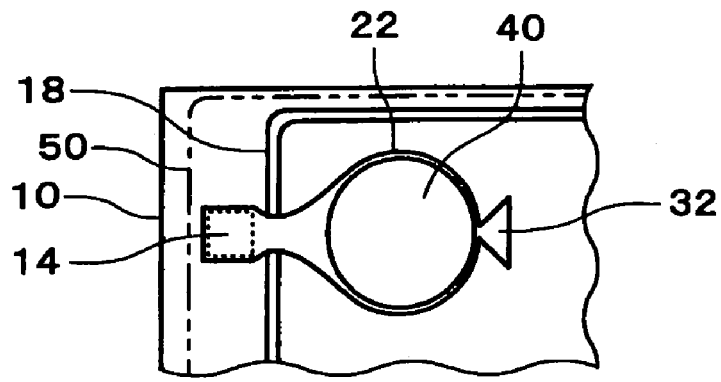
FIG. 3 shows a partial plan view of a semiconductor device according to an exemplary embodiment of the present invention.
Figure 4:
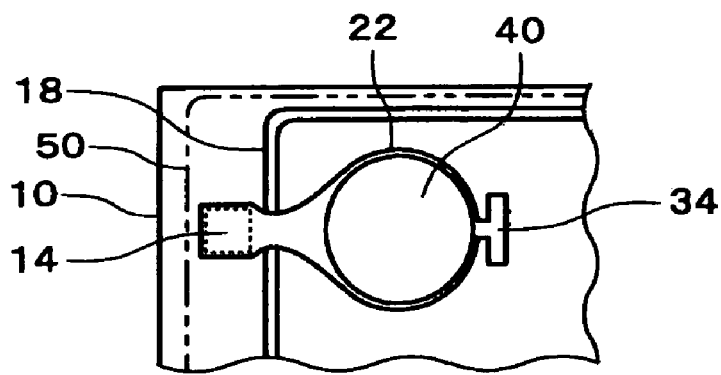
FIG. 4 shows a partial plan view of a semiconductor device according to an exemplary embodiment of the present invention.
Figure 5:
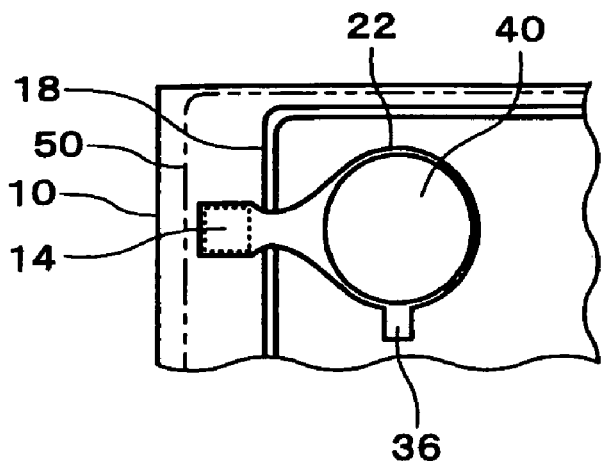
FIG. 5 shows a partial plan view of a semiconductor device according to an exemplary embodiment of the present invention.
Figure 6:
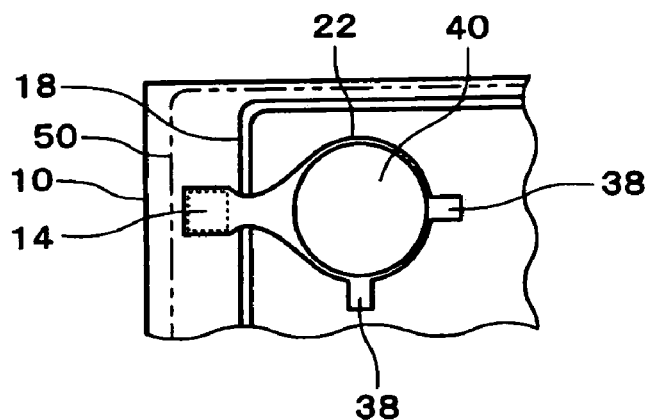
FIG. 6 shows a partial plan view of a semiconductor device according to an exemplary embodiment of the present invention.

The shape of the mark (or the surface shape of the first land 22) is not limited, but may be modified to various shapes as shown in FIGS. 3 through 6. As shown in FIG. 3, the protrusion as a mark 32 may be shaped as a triangle. As shown in FIG. 4, the protrusion as a mark 34 may be shaped as a combination of multiple polygons (e.g., a convex shape). As shown in FIG. 5, the position of the protrusion as a mark 36 may not be limited to the opposite side to a line of the first land 22, but the protrusion can be, for example, positioned at the point having a normal perpendicular to a normal at the line. As shown in FIG. 6, the plural protrusions as marks 38 may be disposed at plural positions (e.g., the both positions shown in FIGS. 1 and 5).

Figure 7:
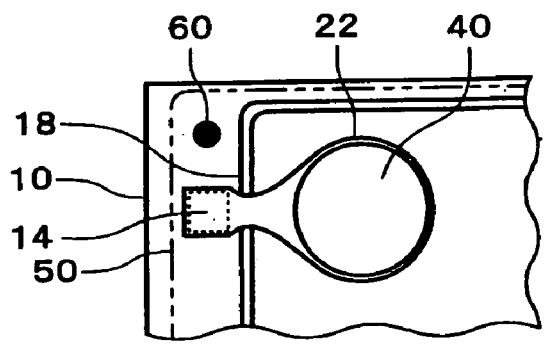
FIG. 7 shows a partial plan view of a semiconductor device according to an exemplary embodiment of the present invention.
Figure 8:
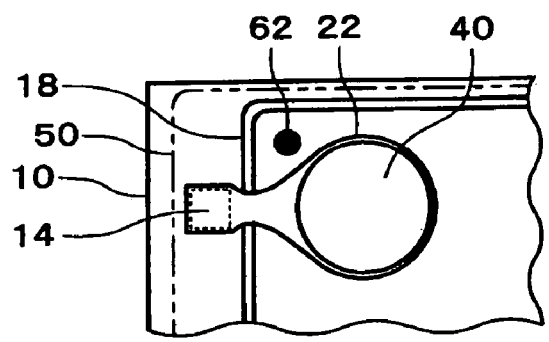
FIG. 8 shows a partial plan view of a semiconductor device according to an exemplary embodiment of the present invention.

As a modification of the present exemplary embodiment, a mark 60 (a mark 62) may be provided independently from discrete regions of the interconnection layer 20, as shown in FIGS. 7 and 8. That is, the mark 60 (the mark 62) may be provided on a region not contacting the discrete regions of the interconnection layer 20 (the land 22). As an example shown in FIG. 7, the mark 60 can be formed on a passivation 16 (See FIG. 2.) in the same process as that for the interconnection layer 20, as previously described. As an example shown in FIG. 8, the mark 62 may be formed on the resin layer 18 in the same process as that for the interconnection layer 20, as previously described. According to the above, since the mark may be provided without any limitations derived from the position of the land, the mark may be provided on a position easy to be recognized resulting in easy determination of an orientation of the semiconductor device. Furthermore, since the mark need not be positioned adjacent to the discrete regions of the interconnection layer 20, the flexibility of the interconnection layer 20 in wiring from electrodes 14 to the land 22 can be enhanced. Also, as shown in FIGS. 7 and 8, the mark 60 (the mark 62) may be provided at least one of the four corners of the semiconductor chip.

As a modification of the present exemplary embodiment, the semiconductor device may include a substrate (e.g., an interposer) and a semiconductor chip (on which an integrated circuit is formed) mounted on the substrate. In this case, there is formed on the substrate an electrode (e.g., a terminal portion of an interconnection pattern) electrically connected to the integrated circuit of the semiconductor chip. A mark to determine an orientation of the semiconductor device is formed on the substrate (more precisely, on the same side of the substrate as the side provided with the electrode).

According to the semiconductor device of the present exemplary embodiment, by recognizing the mark 30 through the insulation layer 50 from the external terminals 40 side of the substrate (the semiconductor substrate 10), an orientation of the semiconductor device can easily be determined. Thus, an orientation of the semiconductor device can be determined from the structure of the semiconductor device in itself offering high efficiency in handling of the semiconductor device.

A semiconductor device manufacturing method according to another exemplary embodiment includes: forming the mark 30 on one side (e.g., the side on which the electrodes 14 are formed) of the substrate (the semiconductor substrate 10 in the present exemplary embodiment); forming the external terminals 40 on the same side of the semiconductor device as the side provided with the mark 30; and providing the insulation layer 50 so as to cover the mark 30. Since the insulation layer 50 has translucency as previously described, the mark 30 can be recognized through the insulation layer 50. If the semiconductor wafer is used as the semiconductor substrate 10, the semiconductor substrate 10 is cut into plural regions each corresponding to the integrated circuit 12. A plurality of semiconductor devices is obtained by cutting the semiconductor substrate 10. In this case, packaging is performed every wafer. Note that other details and advantages of the present exemplary embodiment can be reached from the above description regarding the semiconductor device, and therefore are omitted from the description of this section.

A semiconductor device mounting method according to still another exemplary embodiment includes mounting the semiconductor device 1 (including a semiconductor chip) on a circuit board (e.g., a mother-board (See FIG. 9.)), and a mounting orientation of the semiconductor device 1 is determined by recognizing the mark 30 through the insulation layer 50. According to the above, the orientation of the semiconductor device can be determined from the structure thereof in itself. Note that other details and advantages of the present exemplary embodiment can be reached from the above description regarding the semiconductor device, and therefore are omitted from the description of this section.

Figure 9:
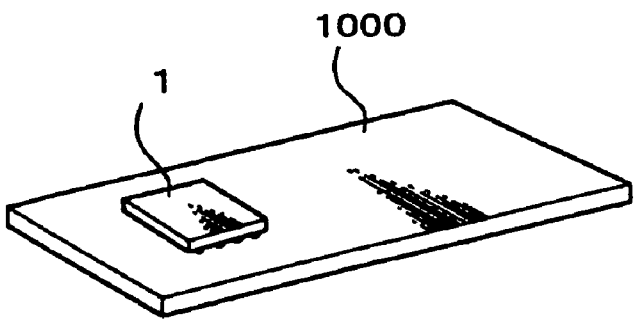
FIG. 9 shows a circuit board according to an exemplary embodiment of the present invention.
Figure 10:
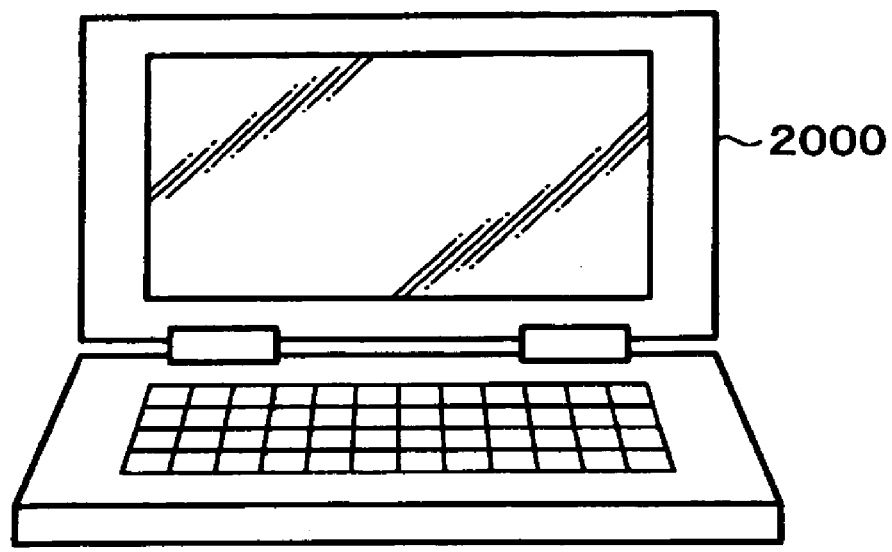
FIG. 10 shows an electronic apparatus according to an exemplary embodiment of the present invention.
Figure 11:
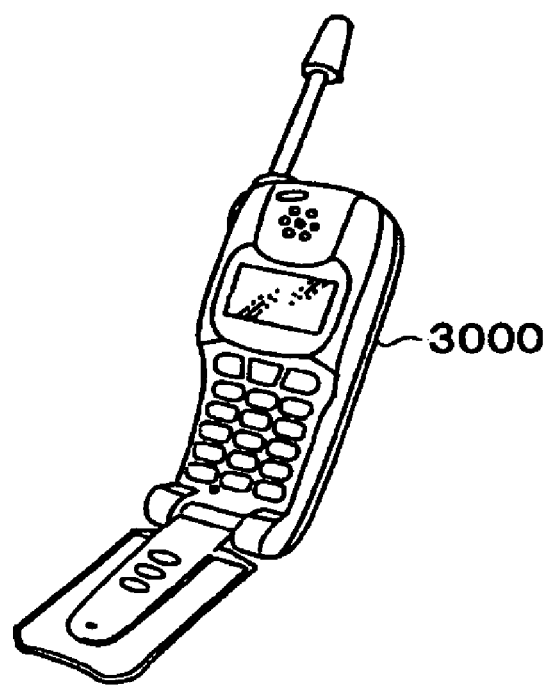
FIG. 11 shows an electronic apparatus according to an exemplary embodiment of the present invention.

FIG. 9 shows a circuit board 1000 according to still another exemplary embodiment of the present invention having the semiconductor device 1 mounted thereon. As an electronic apparatus according to still another exemplary embodiment of the present invention including the semiconductor device, FIG. 10 shows a laptop personal computer 2000, and FIG. 11 shows a cellular phone 3000.

The present invention is not limited to the aforementioned exemplary embodiments, but various modifications thereof are possible. For example, the present invention may include substantially the same structures as explained in the description of the exemplary embodiments (e.g., structures with the same function, way, and results or structures with the same objects and results). Furthermore, the present invention may include structures obtained by replacing a nonessential part of the structure explained in the description of the exemplary embodiments. Still further, the present invention may include structures offering the same action and results or structures achieving the same object as the structures explained in the description of the exemplary embodiments. Still further, the present invention includes structures obtained by combining prior art with the structure explained in the description of the exemplary embodiments.

What is claimed is:

1. A semiconductor device, comprising:
   a substrate including an electrode electrically connected to at least one integrated circuit;
   a resin layer formed on the side of the substrate where the electrode is formed, avoiding the location of the electrode;
   an interconnection layer extending from the electrode to an upper surface of the resin layer and including at least one land formed on the resin layer;
   an external terminal being provided on the land and electrically connected to the electrode;
   a light transmissive insulation layer disposed on the external terminal side of the substrate, the insulation layer being formed to cover the interconnection layer with at least a part of the external terminal exposed; and
   a mark provided on the substrate and covered by the light transmissive insulation layer so as to be visible through the insulation layer,
   wherein the substrate is a semiconductor substrate, and the integrated circuit is formed on the semiconductor substrate.

2. The semiconductor device according to claim 1, the mark being provided on the resin layer.

3. The semiconductor device according to claim 1, further comprising:
   a passivation film provided on the semiconductor substrate,
   the mark being provided on the passivation film.

4. The semiconductor device according to claim 1, the mark being made of the same material as at least a part of the material which the interconnection layer is made of.

5. The semiconductor device according to claim 1, the mark being provided on an area not in contact with the interconnection layer.

6. The semiconductor device according to claim 1, the interconnection layer having a plurality of lands including a first land having a shape incorporating the mark and a second land having a shape different from the shape of the first land.

7. The semiconductor device according to claim 1, the external terminal being a solder ball, and the insulation layer being a solder resist.

8. The semiconductor device according to claim 1, the semiconductor substrate being a semiconductor wafer including the integrated circuit for each of plural areas.

9. The semiconductor device according to claim 1, the semiconductor substrate being a semiconductor chip.

10. The semiconductor device according to claim 9, the mark being provided on at least one of the four corners of the semiconductor chip.

11. A circuit board, comprising a semiconductor device, the semiconductor device, comprising:
    a substrate including an electrode electrically connected to at least one integrated circuit;
    a resin layer formed on the side of the substrate where the electrode is formed, avoiding the location of the electrode;
    an interconnection layer extending from the electrode to an upper surface of the resin layer and including at least one land formed on the resin layer;
    an external terminal being provided on the land and electrically connected to the electrode;
    a light transmissive insulation layer disposed on the external terminal side of the substrate, the insulation layer being formed to cover the interconnection layer with at least a part of the external terminal exposed; and
    a mark provided on the substrate and covered by the light transmissive insulation layer so as to be visible through the insulation layer.

12. An electronic apparatus, comprising a circuit board according to claim 11.

13. A method of mounting a semiconductor device, comprising a substrate including an electrode electrically connected to at least one integrated circuit; a resin layer formed on the side of the substrate where the electrode is formed, avoiding the location of the electrode; an interconnection layer extending from the electrode to an upper surface of the resin layer and including at least one land formed on the resin layer; an external terminal being provided on the land and electrically connected to the electrode; a light transmissive insulation layer disposed on the external terminal side of the substrate, the insulation layer being formed to cover the interconnection layer with at least a part of the external terminal exposed; and a mark provided on the substrate and covered by the light transmissive insulation layer so as to be visible through the insulation layer, onto a circuit board, the method comprising:
    determining a mounting orientation of the semiconductor device by recognizing the mark through the insulation layer.

* * * * *